United States Patent [19]

Tzeng

[11] Patent Number: 5,111,270
[45] Date of Patent: May 5, 1992

[54] THREE-DIMENSIONAL CONTACTLESS NON-VOLATILE MEMORY CELL

[75] Inventor: Jyh-Cherng J. Tzeng, Sunnyvale, Calif.

[73] Assignee: Intel Corporation, Santa Clara, Calif.

[21] Appl. No.: 483,466

[22] Filed: Feb. 22, 1990

[51] Int. Cl.⁵ .................. H01L 29/68; H01L 29/78; H01L 29/06; H01L 27/10

[52] U.S. Cl. .................. 357/23.5; 357/23.6; 357/55; 357/56; 357/45

[58] Field of Search .............. 357/23.5, 23.6, 55, 357/56, 45; 365/185, 104, 51

[56] References Cited

U.S. PATENT DOCUMENTS

| | | | |
|---|---|---|---|
| 4,099,196 | 6/1977 | Simko | 357/23 |
| 4,114,255 | 9/1978 | Salsburg et al. | 437/43 |
| 4,119,995 | 11/1981 | Simko | 357/23 |
| 4,203,158 | 5/1980 | Frohman-Bentchkowsky et al. | 365/185 |
| 4,257,056 | 6/1979 | Shum | 357/23 |
| 4,267,632 | 5/1981 | Shappir | 437/41 |
| 4,376,947 | 9/1979 | Chiu et al. | 357/23 |
| 4,460,981 | 7/1984 | Van Buskirk et al. | 365/104 |
| 4,698,787 | 10/1987 | Mukherjer et al. | 365/185 |
| 4,698,787 | 11/1984 | Mukherjee et al. | 365/185 |
| 4,698,900 | 10/1987 | Esquivel | 357/23.5 X |
| 4,758,869 | 8/1986 | Eitan et al. | 357/23.5 |
| 4,780,424 | 10/1988 | Holler et al. | 437/29 |
| 4,835,741 | 5/1989 | Baglec | 365/185 |

FOREIGN PATENT DOCUMENTS

0164605 12/1985 opean Pat. Off. .
0211632 2/1987 opean Pat. Off. .
0247875 12/1992 opean Pat. Off. .

Primary Examiner—William Mintel
Assistant Examiner—Roy Potter
Attorney, Agent, or Firm—Blakely, Sokoloff, Taylor & Zafman

[57] ABSTRACT

A three-dimensional contactless non-volatile memory cell is described. The memory cell comprises a substrate, source/drain regions that function as buried bitlines and define a channel therebetween, a floating gate disposed above and insulated from the channel, and a control gate disposed above and insulated from the floating gate. The floating gate is formed to an adequate thickness so as to allow capacitive coupling to the control gate along the vertical regions of the floating gate. Thus, a reduction in minimum cell size can be achieved by decreasing the lateral dimensions of the cell without compromising the total capacitive coupling area. Subsequently, a substantial reduction in the total array area and a corresponding increase in device density can be realized. Further features of the invention include elimination of thick oxide regions in the array and improved gate oxide quality.

13 Claims, 5 Drawing Sheets

FIG_1

FIG_2

FIG_3

FIG_6

FIG_5

FIG_7

FIG_8

THREE-DIMENSIONAL CONTACTLESS NON-VOLATILE MEMORY CELL

FIELD OF THE INVENTION

The invention relates to the field of semiconductor memory devices employing floating gates and the processes and methods for fabricating these devices.

BACKGROUND OF THE INVENTION

Memory cells which have members which may be electrically charged are well-known in the prior art. Most often, these cells employ polysilicon floating gates which are completely surrounded by insulation (e.g., silicon dioxide). These gates are electrically charged by electron transfer from the substrate through a variety of mechanisms such as avalanche injection, channel injection, tunneling, etc. The presence or absence of this charge represents a stored, binary information. An early example of such a device is shown in U.S. Pat. No. 3,500,142.

One category of semiconductor floating gate memory devices are both electrically programmable and electrically erasable (EEPROMs). Such a device is shown in U.S. Pat. No. 4,203,158. These cells are characterized by a substrate region including source and drain regions which define a channel therebetween. Disposed above this channel is a floating gate separated from the substrate region by a relatively thin gate insulative material. Typically, a layer of silicon dioxide is employed as the insulator. A control gate is disposed above, and insulated from, the floating gate. Normally, the control gate is also fabricated of polysilicon.

A more recent category of floating gate memory devices uses channel injection for charging the floating gate and tunnelling for removing charge. For these devices the memory cell comprises only a single device and the entire memory array is erased at one time. That is, individual cells or groups of cells are not separately erasable as in current EEPROMs. These memories are sometimes referred to as flash EPROMs or flash EEPROMs. An example of these devices is disclosed in pending application Ser. No. 892,446, filed Aug. 4, 1986, entitled "Low Voltage EEPROM Cell", which application is assigned to the assignee of the present application. U.S. Pat. No. 4,698,787 of Mukherjee et al., also discloses an electrically erasable programmable memory device which is programmed by hot-electron injection from the channel onto the floating gate, and erased by Fowler-Nordheim tunnelling from the floating gate to the substrate.

The principle upon which these EEPROM cells operate is that electrons (i.e., charge) are stored on the floating gate in a capacitive manner. By way of example, during programming of an EEPROM device, the control gate is usually taken to a high positive potential ranging between 12 and 20 volts. The source is grounded and the drain is taken to an intermediate potential of approximately 7 volts. This creates a high lateral electrical field within the channel region nearest to the drain. The high lateral electric field accelerates electrons along the channel region to the point where they become "hot". These hot-electrons create additional electron-hole pairs through impact ionization. A large number of these electrons are attracted to the floating gate by the large positive potential on the control gate.

During erasing of an EPROM device, the control gate is usually grounded and the drain is left unconnected. The source is taken to a high positive potential, creating a high vertical electric field from the source to the control gate. Charge is erased from the floating gate by the mechanism of Fowler-Nordheim tunnelling of electrons through the gate oxide region between the source and the floating gate in the presence of such a field.

In certain instances, floating gate memory devices are fabricated in arrays where each device or device pair is separated from other devices by thick field oxide regions. An example of this is shown in U.S. Pat. No. 4,114,255. In these arrays a metal contact is ordinarily required for each device or device pair. Obviously, these metal contacts limit the reduction of device area.

Other architectures substantially reduce the number of metal contacts required by employing elongated source/drain regions disposed beneath oxide regions. These arrays sometimes are referred to as having "buried bit lines" or using "contactless cells" and need virtual ground circuitry for sensing and programming. An example of this type of array is shown in U.S. Pat. No. 4,267,632; virtual ground circuitry is shown in U.S. Pat. No. 4,460,981. A process for fabricating an electrically alterable contactless memory array is described in U.S. Pat. No. 4,780,424 of Holler et al., which is assigned to the assignee of the present invention.

Although the contactless memory array architecture provides an increase in device density, it is not without certain drawbacks. For instance, prior art floating gate memory devices generally require a relatively thick oxide for capacitive coupling concerns. These thick oxide regions contribute significantly to the overall cell size. Perhaps more importantly, prior art floating gate memory devices are characterized by a floating gate having a large horizontal dimension. Often, as is the case in U.S. Pat. No. 4,780,424, the floating gate extends beyond the channel regions to overlap the isolation regions of the device. This increased lateral dimension is necessary to increase the capacitive coupling between the floating gate and the control gate. This large lateral floating gate dimension further increases the minimal cell dimension geometry for this technology.

As will be seen, the present invention provides an electrically erasable and programmable memory cell which utilizes both the vertical and the planar dimension of the floating gate to achieve a minimal area memory cell. When fabricated in the contactless array, the present invention yields the absolute smallest cell size with any given design rule.

SUMMARY OF THE INVENTION

A novel three-dimensional floating gate memory cell is described along with the process for fabricating the same within an array. In one embodiment, a gate oxide is first formed on a silicon substrate. Over the gate oxide is deposited a layer of polysilicon. This polysilicon layer is etched to form elongated, parallel, spaced-apart polysilicon strips. These strips are used to define the active areas for the memory cells. The polysilicon strips will later comprise the floating gates of the devices. Next, dopants are implanted into the substrate to form source and drain regions in alignment with the floating gate members. By extending the full length of a column, the source/drain regions function as buried bit lines for the array.

Immediately after the removal of the photoresist and after deposition of an interpoly dielectric, a second layer of polysilicon is deposited over the substrate. The second poly layer is formed above, and is insulated from, the first polysilicon layer. This poly2/dielectric/poly1 stack is then etched to define the floating gates and control gates for each of the cells. The control gate is formed by a continuous wordline which extends across a row of the array. Each wordline is patterned so as to be generally perpendicular to the parallel source and drain regions.

The crux of the present invention is the formation of the first polysilicon layer to a sufficient thickness so as to allow capacitive coupling to the control gate member along the vertical (i.e., sidewall) regions of the floating gate member. In this manner, the vertical dimension of the floating gate contributes to the total capacitive coupling area between the floating and control gates. This permits a substantial increase in device density within the array. Currently, a 50% reduction in total array area may be realized.

Further features of the present invention include an improved gate oxide quality due to elimination of thick oxide regions. The gate oxide is also immediately capped by a protective polysilicon layer following its formation to prevent exposure to damaging effects of subsequent processing. The present invention also provides continuous source/drain regions in the form of buried bit lines to eliminate the traditional requirement for a single contact per two cells. Additionally, the present invention saves one critical masking step by utilizing a single masking step to define both the floating gate and the active area for the device.

BRIEF DESCRIPTION OF THE DRAWINGS

FIG. 5 is a perspective view of the cross-sectional elevation view of FIG. 4 following the etching of the second polysilicon layer. FIG. 5 shows the location of buried bit lines and wordline.

DESCRIPTION OF THE PREFERRED EMBODIMENT(S)

A novel three-dimensional non-volatile memory cell is disclosed which utilizes both the vertical and the planar gate dimensions to achieve a minimal area. In the following description, numerous specific details are set forth such as specific doping levels, dimensions, etc., in order to provide a thorough understanding of the present invention. It will be obvious, however, to one skilled in the art that these specific details need not be employed to practice the present invention. In other instances, well-known processing steps are not described in detail in order not to unnecessarily obscure the present invention.

The memory cells of the present invention are fabricated using standard metal-oxide-semiconductor (MOS) processing. The array which contains the cells, in the currently preferred embodiment is fabricated of n-channel devices. A peripheral circuit can employ either n-channel devices or complimentary MOS devices.

Figure 1:
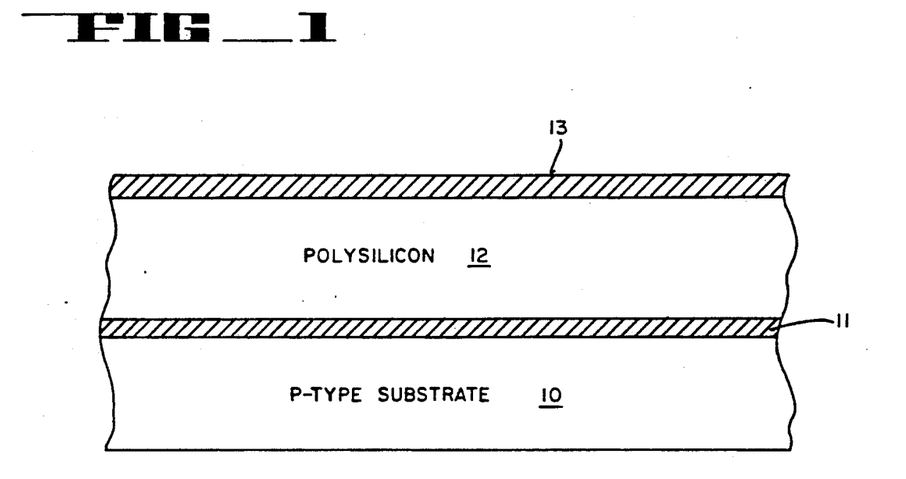
FIG. 1 is a cross-sectional elevation view of a substrate which includes a gate oxide over which has been deposited a polysilicon layer and an additional oxide layer.

With reference to FIG. 1, initially the entire substrate is subjected to a thermal oxidation cycle to thermally grow a gate oxide 11 over p-type monocrystalline silicon substrate 10. Gate oxide 11 is a high-grade thermal oxide which in the currently preferred embodiment assumes a thickness of approximately 110 Å. Note that this thickness is typical for flash applications but may vary for other types of device structures or applications.

By growing the gate oxide (also known as the tunnel oxide) at the beginning of the process, erasing operations are improved as compared to prior art approaches. In the prior art cells the tunnel oxide is usually grown after the formation of field oxidation regions or after the source/drain implants have been performed. Both of these processing steps tend to degrade the quality of the gate oxide. Flash erasure operation is improved by growing the gate oxide early on in the process flow since an exceedingly flat silicon surface is still available. In other words, the substrate surface has not yet been subjected to several implantation or oxidation steps. For example, a high temperature thermal oxidation cycle for growing field oxide regions normally produces a great deal of stress in the neighboring gate oxide regions. Field oxide growth also destroys the planarity of the substrate surface at the ends of the active regions.

Optionally, a voltage threshold adjusting implant may be performed before growth of the gate oxide 11. This threshold adjusting implant may consist of a combination of low energy and high energy boron implants.

After the gate oxide is formed, a layer of polysilicon 12 is then deposited over the substrate. In the currently preferred embodiment, the thickness of polysilicon layer 12 is on the order of 3500 Å. However, thicker polysilicon layers (up to 7500 Å and higher) may also be employed depending on specific design considerations. In other words, the height of the first polysilicon layer 12 may be increased to provide greater capacitive coupling to the control gate member up to the step coverage limit of the particular process, as will be discussed in more detail later.

Next, a layer of oxide 13 is formed over first polysilicon (poly 1) layer 12 either by oxidation or chemical vapor deposition (CVD) techniques. The thickness of layer 13 is generally about 400 Å. The purpose of layer 13 is to prevent polysilicon layer 12 from being doped during subsequent implantation steps. For those applications in which subsequent doping of the polysilicon layer 12 is immaterial (such as is typically the case for EPROM devices) this oxidation step may be omitted from the process flow without departing from the spirit or scope of the present invention.

Figure 2:
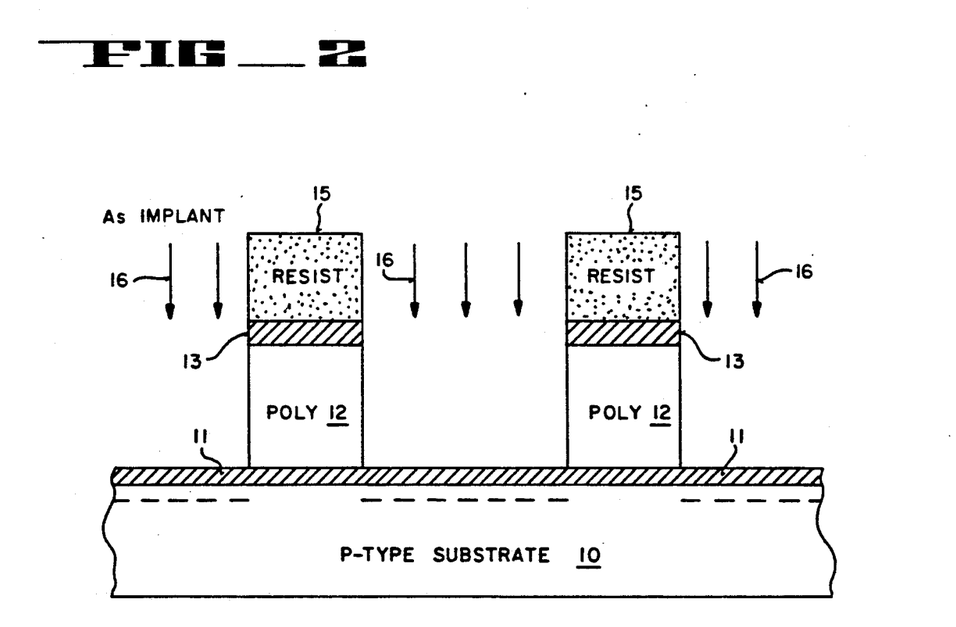
FIG. 2 illustrates the substrate of FIG. 1 after photoresist masking members have been formed and the underlying oxide, polysilicon layers have been etched. This view also illustrates the ion implantation of arsenic into the regions between the masked members.

Referring now to FIG. 2, a single photoresist masking layer 15 is used to define the active channel area for the devices. The portions of oxide layer 13 and polysilicon layer 12 which are not covered by photoresist layer 15 are removed during an etching step. The polysilicon regions underlying masking members 15 are protected during the etching step, with the result being that elongated, parallel, spaced-apart poly 1 strips are formed.

Afterwards substrate 10 is subjected to an arsenic implant as indicated by arrows 16. This implant penetrates through tunnel oxide layer 11 into p-type substrate 10, but not into the polysilicon strips or the underlying substrate regions protected by resist members 15. In the presently preferred embodiment, arsenic is implanted to a level of $1 \times 10^{15}/cm^2$ to $5 \times 10^{15}/cm^2$. This implantation step forms elongated, parallel, spaced-apart doped regions in the substrate. Note that not only do masking members 15 serve as the active channel definition mask, but also as the polysilicon gate mask. This approach saves one critical mask in the process flow and also eliminates registration variations between masking steps.

Figure 3:
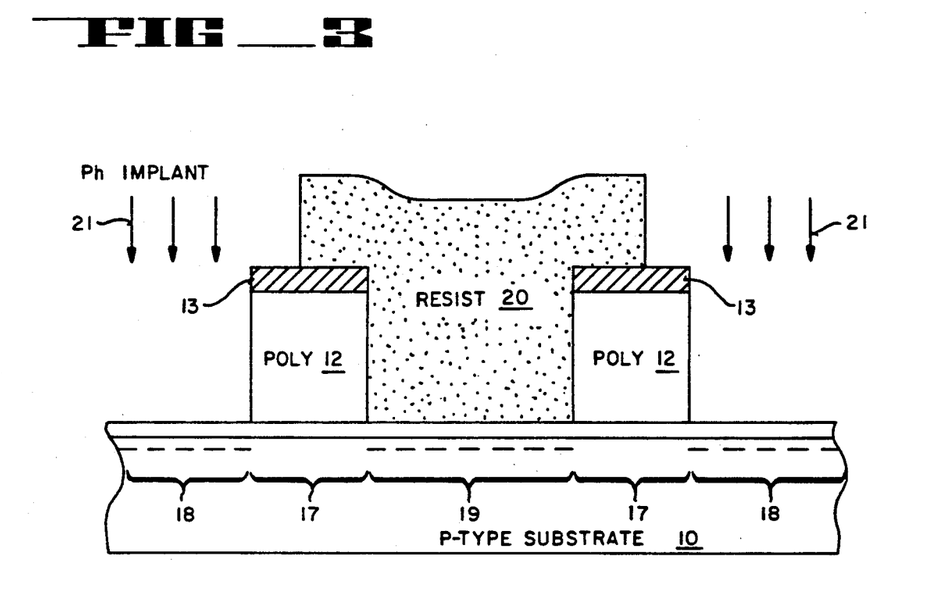
FIG. 3 illustrates the substrate of FIG. 2 during another implantation step.

Next, as illustrated in FIG. 3, alternate ones of the elongated regions between the polysilicon members 12 are covered with a photoresist member 20. The regions directly under photoresist member 20 are thereby protected from exposure during the subsequent ion implant step. The regions 18 are then subjected to a phosphorous implant as shown by arrows 21 in FIG. 3. In the currently preferred embodiment, regions 18 are implanted with phosphorous to a level of approximately $0.5 \times 10^{15}/cm^2$ to $1 \times 10^{15}/cm^2$. Note that this processing step is only required for flash devices and is unnecessary when fabricating ordinary EEPROMs.

Following the phosphorous implantation step, three separate and distinct regions exist within p-type substrate 10. Those regions include n-type doped regions 18 and 19 (region 18 receiving the additional phosphorous implant) and channel regions 17 formed directly beneath first polysilicon members 12. Note that during the phosphorous implant polysilicon members 12 are protected by oxide layer 13. (It should be appreciated that the additional phosphorous implant 21 is generally only required when fabricating flash-type devices, and may be eliminated for ordinary EPROMs or EEPROMs).

After the phosphorous implant has been performed, photoresist member 20 is removed and oxide layer 13 is etched back along with the exposed regions of gate oxide 11. The gate or tunnel oxide 11 directly under polysilicon members 12 is preserved.

Figure 4:
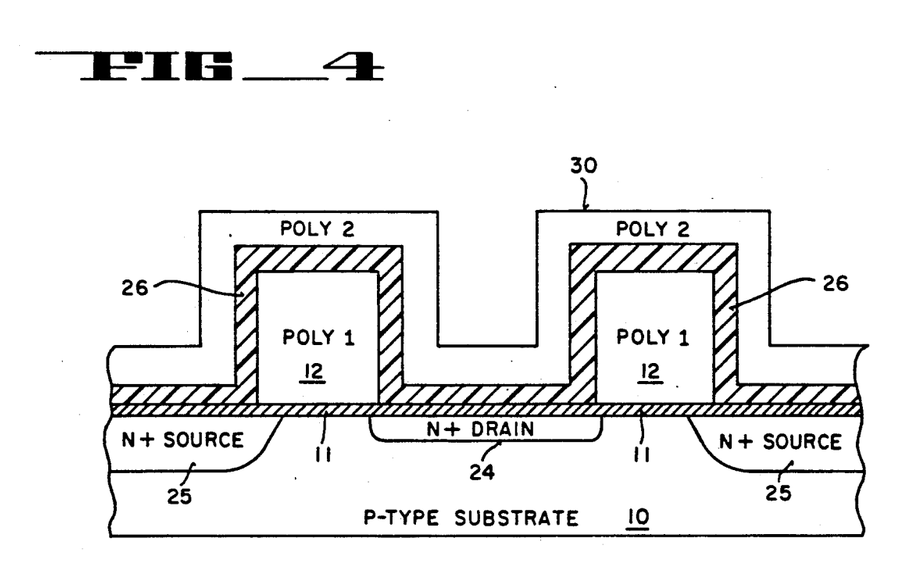
FIG. 4 illustrates the substrate of FIG. 3 following deposition of an interpoly dielectric layer followed by a second polysilicon layer.

A layer of silicon dioxide, or preferably interpoly dielectric layer 26 comprising an oxide/nitride/oxide (ONO) stack is then deposited over first polysilicon members 12 as shown in FIG. 4. The thickness of interpoly dielectric 26 is about 200 Å in the currently preferred embodiment. A second polysilicon layer 30 is then deposited over dielectric layer 26. The thickness of layer 30 is approximately 3000 Å in the presently preferred embodiment. This second polysilicon (poly 2) layer is masked and layers 30, 26 and 12 are etched to define the control gate and floating gate members for the array. The poly 2 layer is patterned into wordlines which completely cover the floating gates as they extend across a row of the array.

Note that in FIG. 4, the elongated parallel, spaced-apart implanted substrate regions are now shown as source and drain regions 25 and 24, respectively.

A key feature of the present invention is the vertical dimension of the polysilicon floating gate members 12. This vertical dimension, which is typically between 3000–7500 Å thick, increases the capacitive coupling between the floating gate and the control gate. By increasing the vertical height of the floating gate the coupling is enhanced without a corresponding increase in the lateral dimension of the device. Thus, overall cell density is greatly improved. An additional feature characteristic of the cell of FIG. 4. is the absence of field oxide or other thick oxide (e.g., SATO) regions separating each of the devices within the array. In the prior art, thick oxide regions are required to minimize first polysilicon (poly 1) to source/drain capacitance. However, in obviating the large lateral first polysilicon dimension, the corresponding need for thick oxide isolation regions is likewise eliminated. Of course, isolation in the form of field oxide may still be required in the periphery cells, even though it is unnecessary in the central array. Also note that within the array, adjacent cells share common bit lines. For example, in FIG. 4 adjacent memory cells share a common n+ drain 24.

Capacitive coupling between the floating gate and control gate members may be increased in the process simply by increasing the vertical dimension of first polysilicon member 12. As explained above, the increased coupling capacitance is achieved without a corresponding increase in the lateral dimension of the device. In the currently preferred embodiment, channel widths for individual memory cells are on the order of 1.0 microns in width. Furthermore, the elimination of field oxide regions from the memory of the present invention markedly reduces stress in th tunnel oxide regions; thereby providing superior programming and erase performance.

Figure 5:
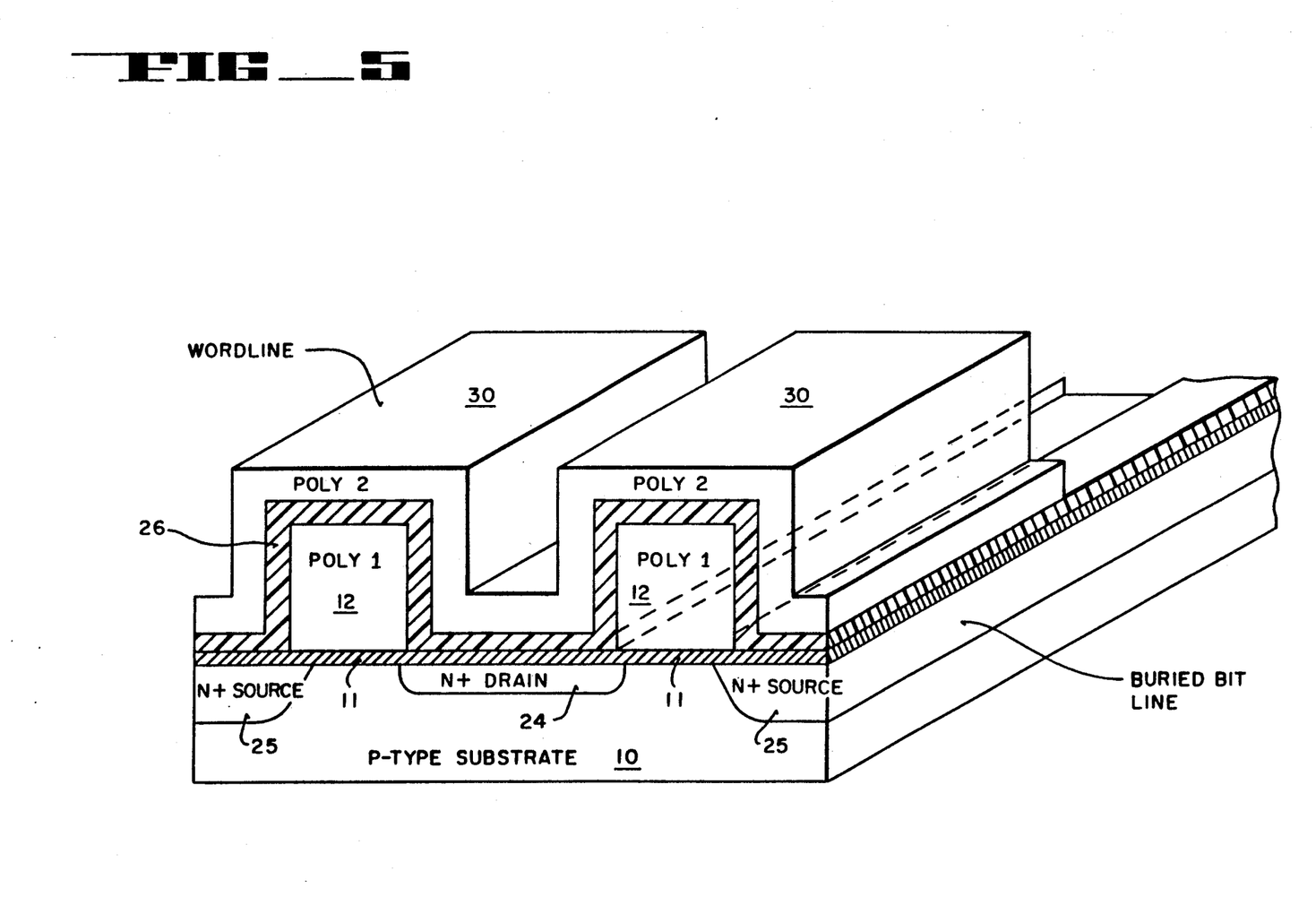

FIG. 5 provides a perspective view of the cross-sectional elevation of FIG. 4. In particular, FIG. 5 more clearly illustrates the location of poly 2 wordline 30 in relation to the underlying source/drain buried bit lines. Wordline 30 is patterned generally perpendicular to the underlying buried bit lines and extends completely across a row of the array. Poly wordlines 30 are defined using an ordinary poly 2/ONO/poly 1 etch cycle. Planarization, passivation, contact formation and metal line formation steps are then performed in an ordinary manner to complete the memory array.

Figure 6:
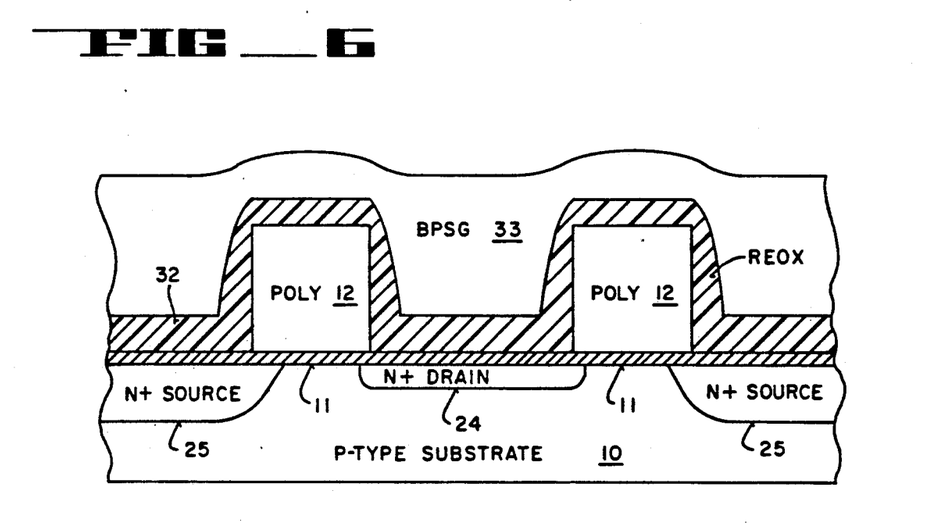
FIG. 6 shows a cross-sectional view of an alternative method of fabrication. Following ion implantation steps, reoxidation and planarization steps are performed.

FIGS. 3–8 shows cross-sectional views of an alternative method of fabrication. In FIG. 6, a high temperature reoxidation follows removal of photoresist member 20 to form oxide layer 32. Oxide 32 protects polysilicon members 12 from later processing steps and increases the oxide thickness over source/drain regions 25 and 24, respectively. A BPSG or TEOS oxide 33 is then deposited to smooth the topology and better planarize the upper surface of the water. A typical thickness for oxide 33 is 1 micron.

Figure 7:
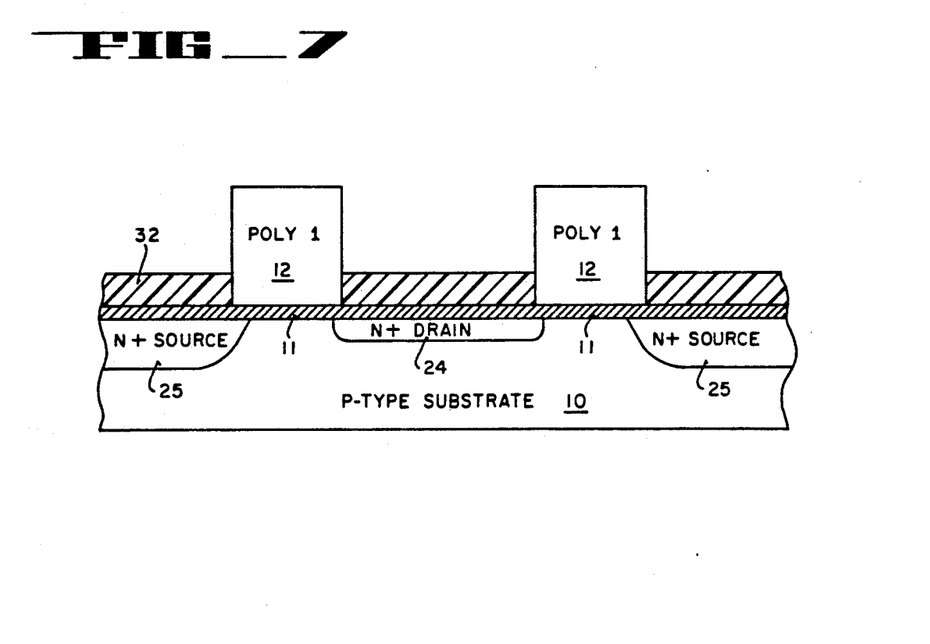
FIG. 7 illustrates the substrate of FIG. 6 following etchback of the upper insulation layers.

An etchback process is then performed so that the oxide regions are recessed from the upper portions of polysilicon members 12 as shown in FIG. 7. As is evident, the etchback process leaves a portion of oxide 32 over the source/drain regions of the device while exposing the vertical extent of polysilicon member 12.

Figure 8:
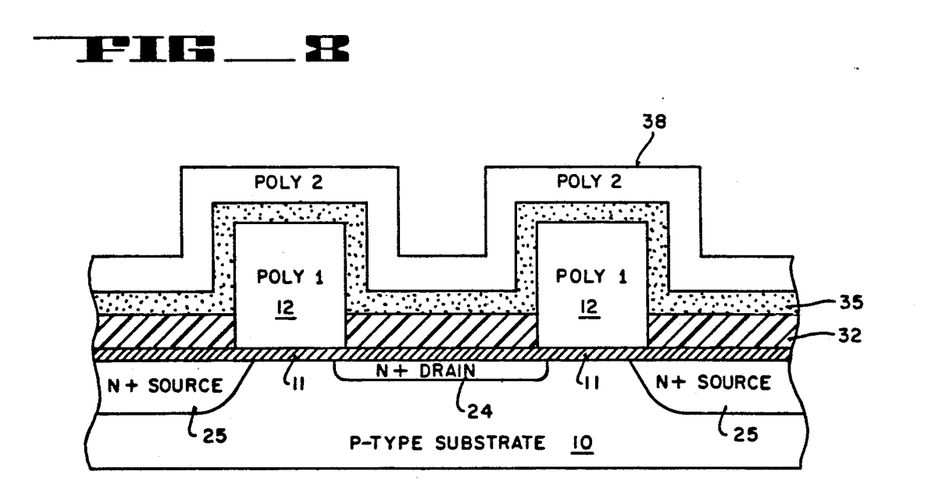
FIG. 8 illustrates the substrate of FIG. 7 after deposition of an interpoly dielectric layer followed by a second polysilicon layer.

FIG. 8 shows the completed device which further includes interpoly dielectric layer 35 and a second polysilicon layer 38. Polysilicon layer 38 is etched along with layers 35 and 12 to define wordline segments for the devices in accordance with the memory array of FIGS. 4–5.

Thus, a three-dimensional contactless non-volatile memory device has been described.

What is claimed is:

1. A three dimensional non-volatile memory cell comprising:
   a substrate of a first conductivity type having a planar upper surface;
   spaced-apart regions of a second conductivity type disposed in said substrate along said upper surface, said spaced-apart regions defining a channel therebetween;
   a first gate member substantially confined above and insulated from said channel, said first gate member storing a charge which affects the conductivity within said channel, said first gate member having a first thickness which obviates the need for isolation regions between adjacent cells;
   a second gate member disposed over and insulated from said first gate member, said second gate member controlling the programming and erasing of said cell and having a second thickness, said first thickness being greater than or equal to said second thickness to provide a vertical dimension which enhances the capacitive coupling between said first and second gate members while minimizing the overall area of said memory cell.

2. The memory cell of claim 1 wherein said cell is programmed by hot electron injection of electrons from said substrate to said first gate member and erased by Fowler-Nordheim tunnelling of electrons from said first gate member to said substrate.

3. The memory cell of claim 2 wherein said first thickness is greater than 30% of the width of said channel.

4. The memory cell of claim 2 wherein said first gate member comprises polysilicon.

5. The memory cell of claim 4 wherein said first thickness is between 3500 and 7500 Å thick and said channel is approximately 1 micron wide.

6. The memory cell of claim 5 wherein said second conductivity type is n-type.

7. The memory cell of claim 6 wherein said second gate member extends over portions of said spaced-apart regions and is insulated from said spaced-apart regions by a dielectric material which is at least 200 Å thick.

8. A three-dimensional electrically programmable and electrically erasable memory device formed in a silicon substrate, said device comprising a plurality of memory cells arranged in rows and columns as an array, each of said cells comprising:
   first and second spaced-apart regions of a conductivity type opposite to that of said substrate, said first and second regions being disposed along the planar upper surface of said substrate and defining a channel region therebetween, at least one of said spaced-apart regions being shared by an adjacent cell;
   a floating gate disposed above and insulated from said planar upper surface of said substrate for storing a charge which affects the conductivity within said channel region, said floating gate being largely confined over said channel region to minimize capacitive coupling from said floating gate to said spaced-apart regions, thereby obviating the need for insulative regions to isolate adjacent cells; and
   a control gate extending over and insulated from said floating gate for controlling the programming and erasing of said floating gate, said control gate having a second thickness which is less than or equal to said first thickness, said first thickness providing a vertical dimension which enhances the capacitive coupling between said control gate and said floating gate while minimizing the overall size of said cell.

9. The device of claim 8 wherein each of said cells are programmed by hot electron injection of electrons from said substrate to said floating gate, and erased by Fowler-Nordheim tunneling of electrons from said floating gate to said substrate.

10. The device of claim 9 wherein said vertical dimension is greater than 30% of the width of said channel region.

11. The device of claim 10 wherein said floating gate member comprises polysilicon.

12. The device of claim 10 wherein said first thickness is between 3500 and 7500 Å thick.

13. The device of claim 12 wherein said conductivity type of said spaced-apart regions is n-type.

* * * * *

UNITED STATES PATENT AND TRADEMARK OFFICE
CERTIFICATE OF CORRECTION

PATENT NO. : 5,111,270
DATED : 5/5/92
INVENTOR(S) : Jyh-Cherng J. Tzeng

It is certified that error appears in the above-indentified patent and that said Letters Patent is hereby corrected as shown below:

Col. 6, Line 31     Delete "th"     Insert --the--

Col. 6, Line 45     Delete "3"      Insert --6--

Col. 6, Line 53     Delete "water"  Insert --wafer--

Signed and Sealed this

Twenty-ninth Day of March, 1994

Attest:

BRUCE LEHMAN

*Attesting Officer*     *Commissioner of Patents and Trademarks*